US011611281B2

(12) United States Patent
Nakamura et al.

(10) Patent No.: US 11,611,281 B2
(45) Date of Patent: Mar. 21, 2023

(54) MULTIPLE OUTPUT ISOLATED POWER SUPPLY FOR AUTOMATED TEST EQUIPMENT AND A METHOD FOR PROVIDING MULTIPLE ISOLATED OUTPUT VOLTAGES

(71) Applicant: Advantest Corporation, Tokyo (JP)

(72) Inventors: Atsushi Nakamura, Munich (DE); Anton Thoma, Munich (DE)

(73) Assignee: Advantest Corporation, Tokyo (JP)

( * ) Notice: Subject to any disclaimer, the term of this patent is extended or adjusted under 35 U.S.C. 154(b) by 310 days.

(21) Appl. No.: 16/844,172

(22) Filed: Apr. 9, 2020

(65) Prior Publication Data

US 2020/0271717 A1    Aug. 27, 2020

Related U.S. Application Data

(63) Continuation of application No. PCT/EP2019/054918, filed on Feb. 27, 2019.

(51) Int. Cl.
*H02M 3/335*    (2006.01)
*G01R 31/28*    (2006.01)
(Continued)

(52) U.S. Cl.
CPC .... *H02M 3/33561* (2013.01); *G01R 31/2834* (2013.01); *H01F 27/24* (2013.01);
(Continued)

(58) Field of Classification Search
CPC .... H02M 1/00; H02M 1/0003; H02M 1/0045; H02M 3/003; H02M 3/335; H02M 3/33561; G01R 31/2834; H01F 27/24; H01F 27/2804; H01F 2027/2809; H01F 2027/2819; H05K 1/0262; H05K 1/144;
(Continued)

(56) References Cited

U.S. PATENT DOCUMENTS 9,977,476 B2 *   5/2018   Zeng ................. G06F 1/26
10,381,914 B2 *  8/2019   Chen ................ H02M 3/335
(Continued)

FOREIGN PATENT DOCUMENTS

CN    109417351    *   3/2019   ............ H02M 1/44
EP    0641066      *   3/1995   ............ H02M 3/337
(Continued)

OTHER PUBLICATIONS

Anonymous "Dual Power Supply Circuit-12 Volt Regulated Power Supply Diagram" URL: http://www.circuitstoday.com/regulated-dualpower-supply-circuit. Mar. 27, 2019; 10 pages.

*Primary Examiner* — Matthew V Nguyen

(57) ABSTRACT

A multiple output isolated power supply for the usage as a floating V/I source in an automated test equipment. The multiple output isolated power supply includes a multi-layer printed circuit board. Furthermore the multiple output isolated power supply includes a planar transformer, which includes a plurality of secondary windings associated with different output channels, arranged on or in the multi-layer PCB. At least two output channels out of the output channels of the multiple output isolated power supply includes a rectifier and a voltage regulator or a current regulator.

18 Claims, 11 Drawing Sheets

(51) Int. Cl.
*H01F 27/24* (2006.01)
*H01F 27/28* (2006.01)
*H05K 1/14* (2006.01)
*H02M 1/00* (2006.01)
*H02M 3/00* (2006.01)

(52) U.S. Cl.
CPC ........ *H01F 27/2804* (2013.01); *H02M 3/335* (2013.01); *H05K 1/144* (2013.01); *H01F 2027/2809* (2013.01); *H01F 2027/2819* (2013.01); *H02M 1/0045* (2021.05); *H02M 3/003* (2021.05)

(58) Field of Classification Search
CPC ................. H05K 1/165; H05K 3/4644; H05K 2201/086; H05K 2201/09672
See application file for complete search history.

(56) References Cited

U.S. PATENT DOCUMENTS

| | | |
|---|---|---|
| 2006/0038549 A1 | 2/2006 | Mehrotra et al. |
| 2008/0079524 A1* | 4/2008 | Suzuki .................... H01F 27/22 336/61 |
| 2010/0026095 A1 | 2/2010 | Phadke |
| 2011/0278927 A1* | 11/2011 | Phadke ................. H02M 3/285 323/267 |
| 2015/0091466 A1* | 4/2015 | Levy .................... H05B 45/385 315/206 |
| 2017/0093289 A1* | 3/2017 | Yang ................. H02M 3/33592 |

FOREIGN PATENT DOCUMENTS

| | | | | |
|---|---|---|---|---|
| EP | E P-3240176 A1 * | 11/2017 | ............ | H01F 27/10 |
| WO | 01/06631 A1 | 1/2001 | | |

\* cited by examiner

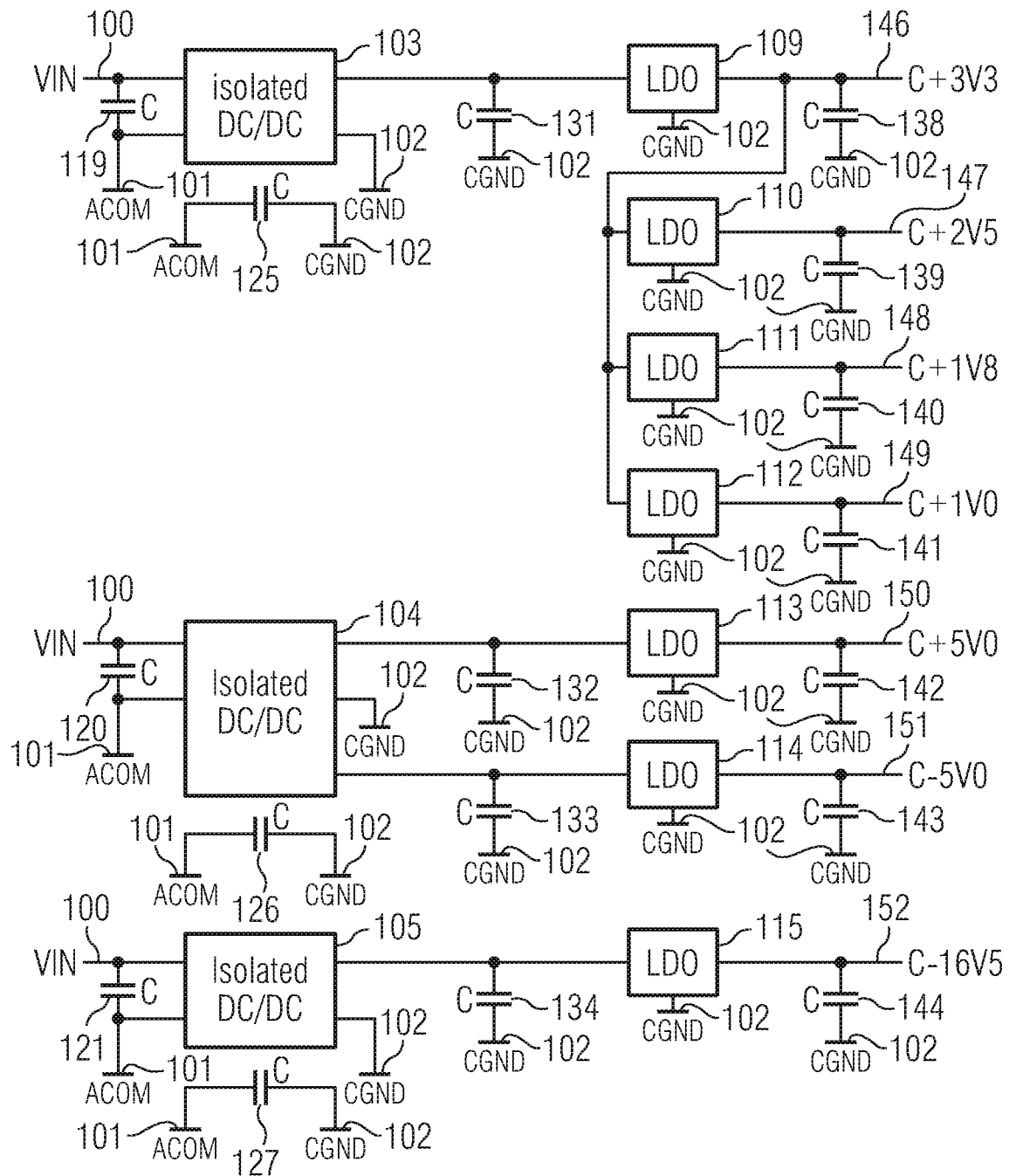
Fig. 2 (Part 1)

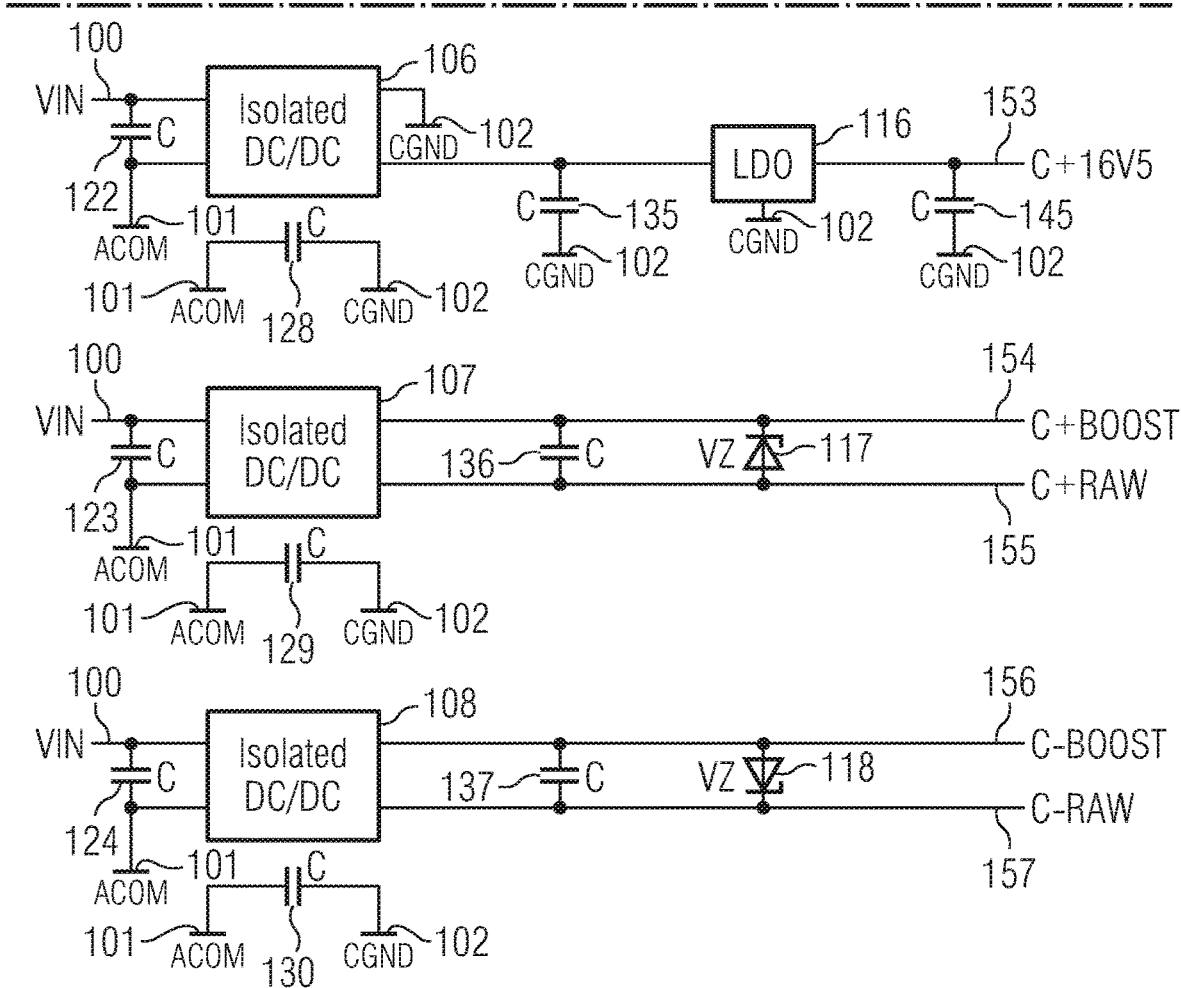
Fig. 2 (Part 2)

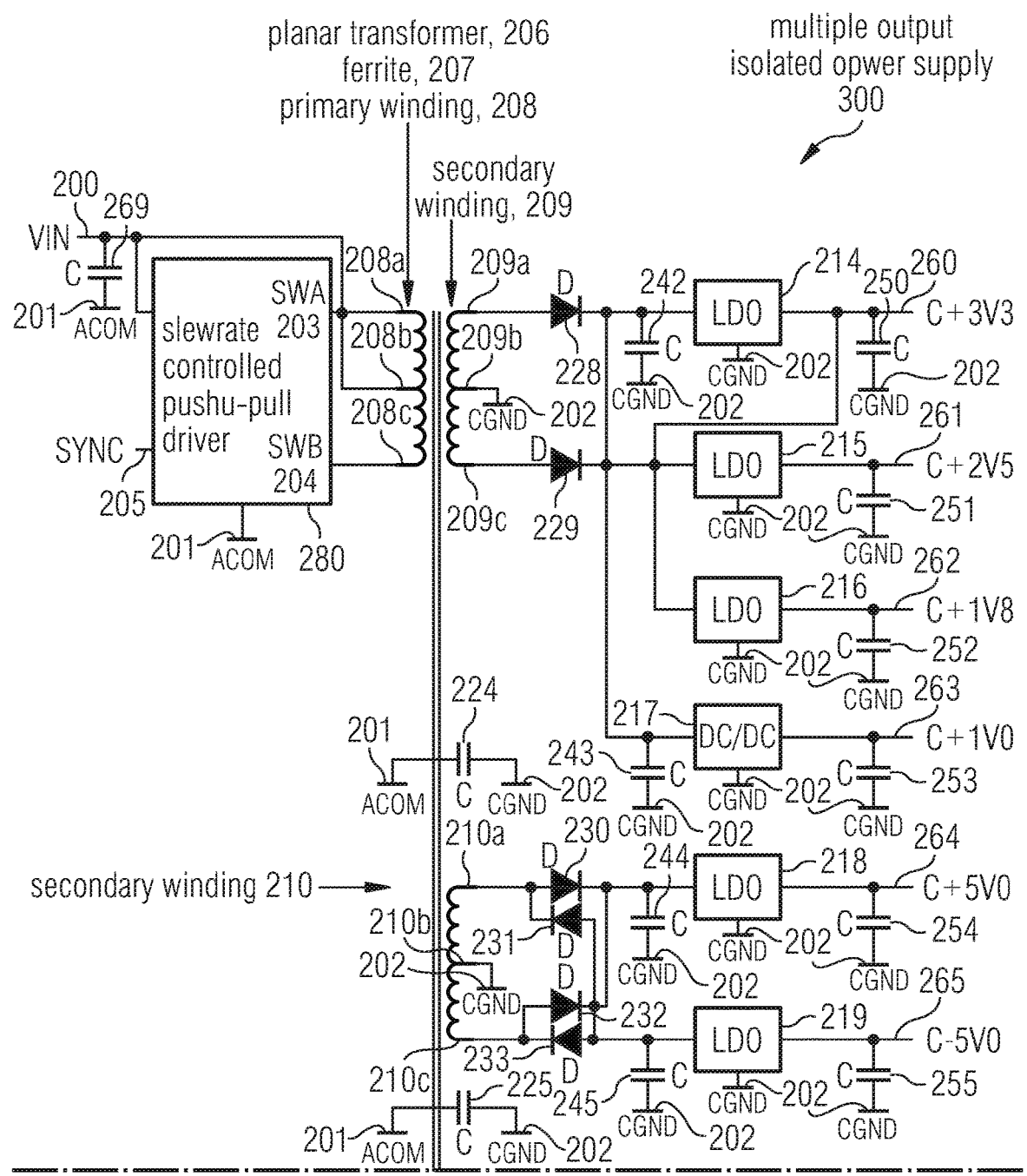
Fig. 3 (Part 1)

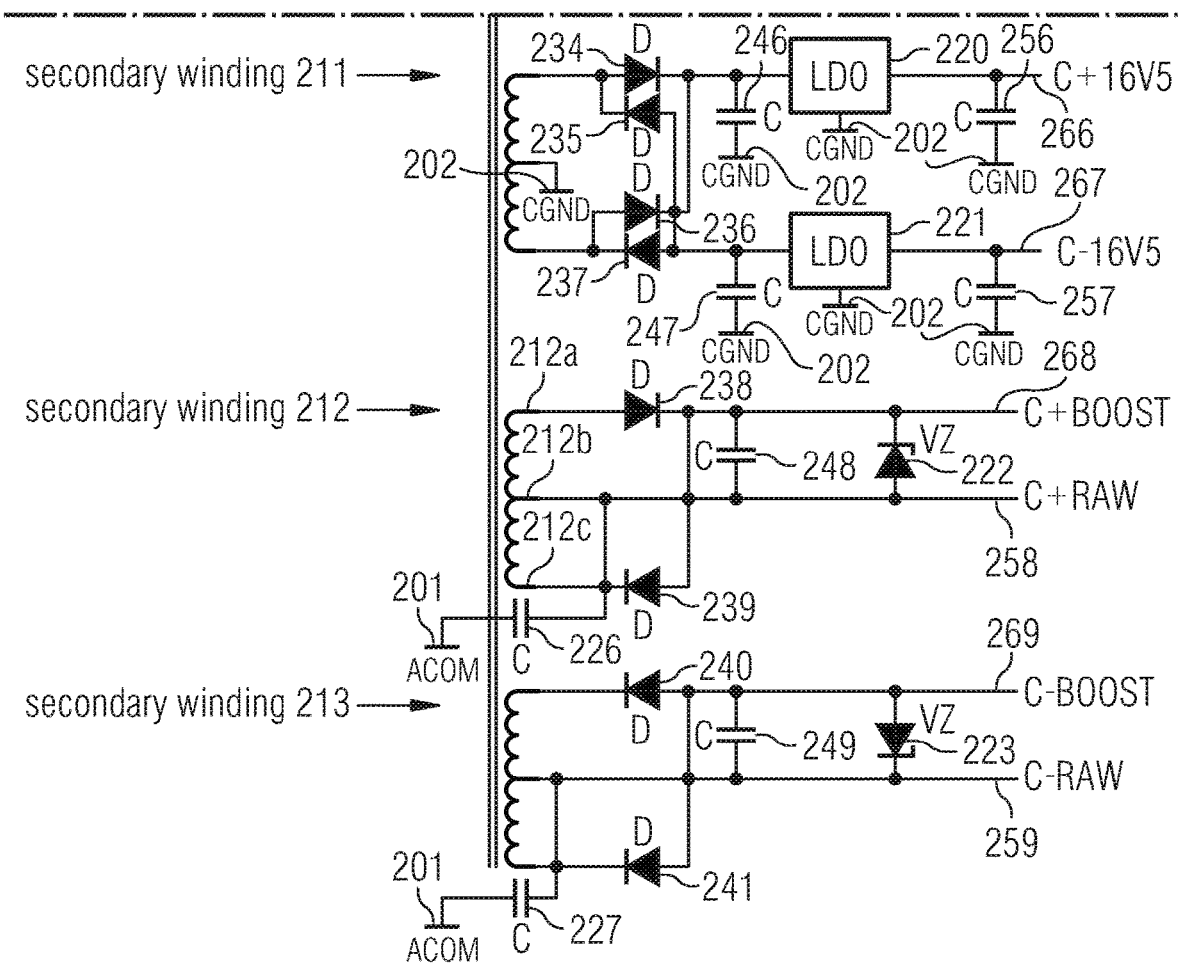
Fig. 3 (Part 2)

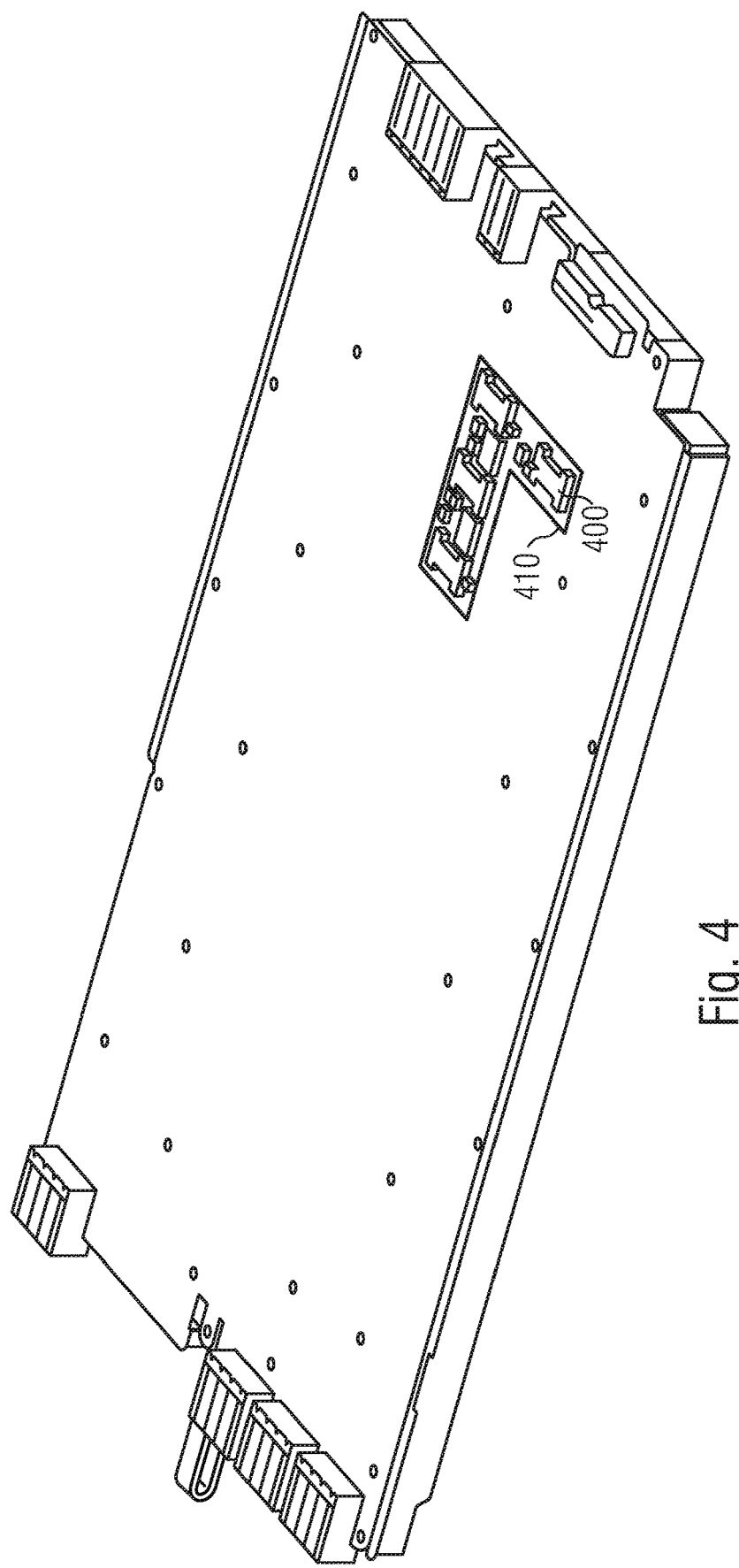

MULTIPLE OUTPUT ISOLATED POWER SUPPLY FOR AUTOMATED TEST EQUIPMENT AND A METHOD FOR PROVIDING MULTIPLE ISOLATED OUTPUT VOLTAGES

CROSS-REFERENCES TO RELATED APPLICATIONS

This application is a continuation of copending International Application No. PCT/EP2019/054918, filed Feb. 27, 2019, which is incorporated herein by reference in its entirety.

BACKGROUND OF THE INVENTION

Most of automatic test equipment (ATE) instruments are non-floating, and (or that means) its negative output terminal is connected to a system- or a common ground (GND), and the voltage potentials appear against GND. Instead (or by contrast) a floating V/I source, the voltage potential appears from positive terminal output to the negative terminal output. There is no conductive connection from either the positive terminal to GND or from negative output terminal to GND. So the floating V/I source operates like a battery.

The necessity of an ATE floating V/I source is increasing in order to test next generation high power devices such as smart power, PMIC or automobile devices which have a high side switch in it. FIG. 8 illustrates a connection between a high side switch 31 (of a DUT 30) and a floating V/I 36 (of the ATE 40) for its testing (or in order to test the high side switch 31). The floating V/I positive and negative terminals are connected to (across) the high side switch 31 in order to apply current to the switch. This explains for example why floating V/I may be used.

Usually V/I source consists of for example a control FPGA, a D to A converter (DAC), an A to D converter (ADC), a power amplifier and an operational amplifier (AMP) etc. Power supplies may be used for example for power amplifiers and for other circuits. It has been found, that non-floating instruments can share these power supplies since the potential is (or their potentials are) equal, however floating instruments need independent isolated power supplies for each channels since the potential is (or their potentials are) not equal. It has also been found, that multiple voltage levels may be used to support these circuits. Conventionally isolated utility supplies exclude power amplifier supply consists from (or which consists of) multiple small size low power isolated DC-DC modules. A use of these multiple DC-DC modules increases the area of the circuit, and/or increase the cost, and/or increases the switching noise and becomes a limitation of the channel density.

Accordingly, there is a need for a multiple output isolated power supply, and/or a power supply arrangement, for the usage as a floating V/I source in an automated test equipment, which provides a better trade-off between surface-area, production costs and signal-to-noise ratio.

SUMMARY

According to an embodiment, a multiple output isolated power supply for the usage as a floating V/I source in an automated test equipment may have: a multi-layer printed circuit board (PCB); and a planar transformer including a plurality of secondary windings associated with different output channels, arranged on or in the multi-layer PCB; wherein at least two output channels out of the output channels include a rectifier and a voltage regulator or a current regulator.

According to another embodiment, a power supply arrangement may have: an isolated raw power supply configured to provide one or more output voltages; an amplifier configured to provide a device under test (DUT) voltage for provision to a DUT on the basis of the one or more output voltages of the raw power supply; and an auxiliary power supply configured to provide a plurality of auxiliary voltages for one or more drive circuits configured to provide a drive signal to the amplifier and for one or more measurement circuits configured to measure a current and/or a voltage provided to the DUT; wherein the auxiliary power supply is an inventive multiple output isolated power supply.

According to another embodiment, an Automatic Test Equipment (ATE) may have: an inventive multiple output isolated power supply or an inventive power supply arrangement.

According to yet another embodiment, a method for providing multiple isolated output voltages for the usage in an automated test equipment may have the steps of: providing a plurality of secondary voltages associated with different output channels using a single planar transformer; and rectifying the secondary voltages, to achieve rectified secondary voltages; and providing the output voltages on the basis of rectified secondary voltages using a voltage regulation or a current regulation.

An embodiment according to the invention creates a multiple output isolated power supply for the usage as a floating V/I source in an automated test equipment. The multiple output isolated power supply comprises a multi-layer printed circuit board (PCB). The multiple output isolated power supply further comprises a planar transformer, which comprises a plurality of secondary windings associated with different output channels, arranged on or in the multi-layer printed circuit board. At least two output channels out of the output channels comprise a rectifier and a voltage regulator or a current regulator.

This multiple output isolated power supply is based on the finding that a planar transformer is very low profile, has excellent thermal characteristics, has a low leakage inductance, has an excellent repeatability and costs less than a conventional transformer.

Furthermore, the planar transformer of the invention, which typically comprises a primary winding and a plurality of secondary windings around the same core, is configured to provide a plurality of secondary output voltages driven by the same magnetic flux. This facilitates the primary-side circuit, since one primary side driver circuit may be sufficient.

Moreover, the planar transformer of the invention, which typically comprises a primary winding and a plurality of secondary windings around the same core, is easier to design by setting the turns ratios of the secondary windings. Furthermore, the planar transformer provides an isolation between the primary and the secondary winding.

In an advantageous embodiment, the multiple output isolated power supply comprises a high frequency slew-rate controlled push pull driver, configured to drive a primary winding of the planar transformer. Accordingly, while in conventional solutions during the turn-off of the switches, a leakage inductance causes a large undesirable voltage spike and become radiated electromagnetic interference (EMI), by controlling switch voltage slew rate and switch current slew rates, undesired voltage spike can be reduced, resulting the DC/DC (converter) becoming a low noise (EMI) voltage supply.

In an advantageous embodiment, the core of the planar transformer of the multiple output isolated power supply is a ferrite core. A ferrite core is used for its high permeability and its low electrical conductivity. These two properties allow ferrite to prevent eddy currents, resulting a more efficient planar transformer. Moreover, a ferrite core is cheaper than cores made of other materials (for example silicon-steel). Furthermore, a ferrite core is easily fitted into a hole in the multi-layer PCB.

In an advantageous embodiment, at least one of the rectifiers of the multiple output isolated power supply comprises a Schottky-diode. Schottky-diodes have a very low cut-in voltage, a very low switching time, a very low power consumption and a negligible storage time, resulting a rapidly responding rectifier.

In an advantageous embodiment, at least one of the voltage or current regulator of the multiple output isolated power supply comprises a low drop-out voltage regulator (LDO) or a Zener diode, resulting a simple and cheap solution for voltage regulation or for current regulation.

In an advantageous embodiment, one of the output channels of the multiple output isolated power supply comprises a switching DC/DC converter and a linear voltage regulator (LDO). An input of the switching DC/DC converter and an input of the linear voltage regulator (LDO) are coupled to the secondary winding of the respective output channel. Thus a single secondary winding of the multiple output isolated power supply is used to provide a first output voltage using a linear voltage regulation and to provide a second output voltage using the switching DC/DC converter. Accordingly, it is possible to keep the number of secondary windings of the planar transformer reasonably small, since it is possible to provide multiple output voltages with good efficiency using a single secondary winding.

In an advantageous embodiment, at least one of the secondary windings of the multiple output isolated power supply is configured to be a dual output winding, wherein a tap of the dual output winding is coupled to a secondary reference potential of the multiple output isolated power supply. The multiple output isolated power supply is configured to provide voltages of two different polarities with respect to the secondary reference potential using a rectification and regulation of voltages provided by the dual output winding; thus, allowing a provision of (a plurality of) symmetrical output voltages and/or allowing further reduction of the number of secondary windings.

Another embodiment according to the invention creates a power supply arrangement. The power supply arrangement comprises an isolated raw power supply configured to provide one or more output voltages. The power supply arrangement further comprises an amplifier configured to provide a voltage for provision to a DUT on the basis of the one or more output voltages of the raw power supply. The power supply arrangement further comprises an auxiliary power supply configured to provide a plurality of auxiliary voltages for one or more drive circuits configured to provide a drive signal to the amplifier and for one or more measurement circuits configured to measure a current and/or a voltage provided to the DUT, wherein the auxiliary power supply is a multiple output isolated power supply.

This power supply arrangement is based on the finding that the invented multiple output isolated power supply is low profile, has better thermal characteristics, has a low leakage inductance, has an improved repeatability and costs less than a conventional multiple output isolated power supply.

In an advantageous embodiment, the secondary reference potential (CGND) of the raw power supply is floating with respect to a primary reference potential (PGND), and the secondary reference potential of the raw power supply (CGND) is identical to a secondary reference potential (CGND) of the auxiliary power supply, providing a common ground for the V/I channel of the channel module.

In an advantageous embodiment, the planar transformer of the auxiliary power supply of the power supply arrangement comprises a winding which is coupled to one of the output voltages (C+RAW) of the raw power supply, such that a voltage (C+BOOST) is provided which related to the output voltage (C+RAW) of the raw power supply. Thus, it is possible to provide a voltage for driving amplifying elements (e.g. transistors) of the amplifier with little effort.

Another embodiment according to the invention creates an Automatic Test Equipment (ATE), which comprises a multiple output isolated power supply or a power supply arrangement.

The Automatic Test Equipment is based on the finding that the invented multiple output isolated power supply and the invented power supply arrangement are low profile, has better thermal characteristics, has a low leakage inductance, has an improved repeatability and costs less than a conventional multiple output isolated power supply.

Further embodiments according to the invention create respective methods.

However, it should be noted that the methods are based on the same considerations as the corresponding apparatuses. Moreover, the methods can be supplemented by any of the features, functionalities and details which are described herein with respect to the apparatuses, both individually and taken in combination.

Embodiments according to the invention are related to multiple output isolated power supplies.

Further embodiments according to the invention are related to power supply arrangements.

Further embodiments according to the invention are related to automatic test equipment.

Further embodiments according to the invention are related to a method for providing multiple isolated output voltages for the usage in an automated test equipment.

Embodiments of the present invention relates generally to automated device testing and more specifically to improve density, cost and noise (or signal-to-noise ratio) for a floating V/I source used for automated device testing.

Embodiments according to the invention are related to a low-profile, low-cost and low-noise multiple output isolated power supply for the usage as a floating V/I source in an automated test equipment.

BRIEF DESCRIPTION OF THE DRAWINGS

Embodiments of the present invention will be detailed subsequently referring to the appended drawings, in which:

FIG. 2 shows a schematic diagram of a conventional multiple output isolated utility power supply;

FIG. 3 shows a schematic diagram of an embodiment of the invented multiple output isolated utility power supply;

FIG. 4 shows a 3D model of a conventional multiple output isolated utility power supply;

DETAILED DESCRIPTION OF THE INVENTION

In the following, different inventive embodiments and aspects will be described. Also, further embodiments will be defined by the enclosed claims.

It should be noted that any embodiments as defined by the claims can be supplemented by any of the details (features and functionalities) described herein. Also, the embodiments described herein can be used individually, and can also optionally be supplemented by any of the details (features and functionalities) included in the claims.

Also, it should be noted that individual aspects described herein can be used individually or in combination. Thus, details can be added to each of said individual aspects without adding details to another one of said aspects.

It should also be noted that the present disclosure describes, explicitly or implicitly, features usable in a multiple output isolated power supply, in a power supply arrangement and/or in an automatic test equipment. Thus, any of the features described herein can be used in the context of a multiple output isolated power supply, a power supply arrangement and/or an automatic test equipment.

Moreover, features and functionalities disclosed herein relating to a method can also be used in an apparatus (configured to perform such functionality). Furthermore, any features and functionalities disclosed herein with respect to an apparatus can also be used in a corresponding method. In other words, the methods disclosed herein can be supplemented by any of the features and functionalities described with respect to the apparatuses.

The invention will be understood more fully from the detailed description given below, and from the accompanying drawing of embodiments of the invention, which, however should not be taken to limit the invention to the specific embodiments described, but are for explanation and understanding only.

1. EMBODIMENT ACCORDING TO FIG. 1

Figure 1:
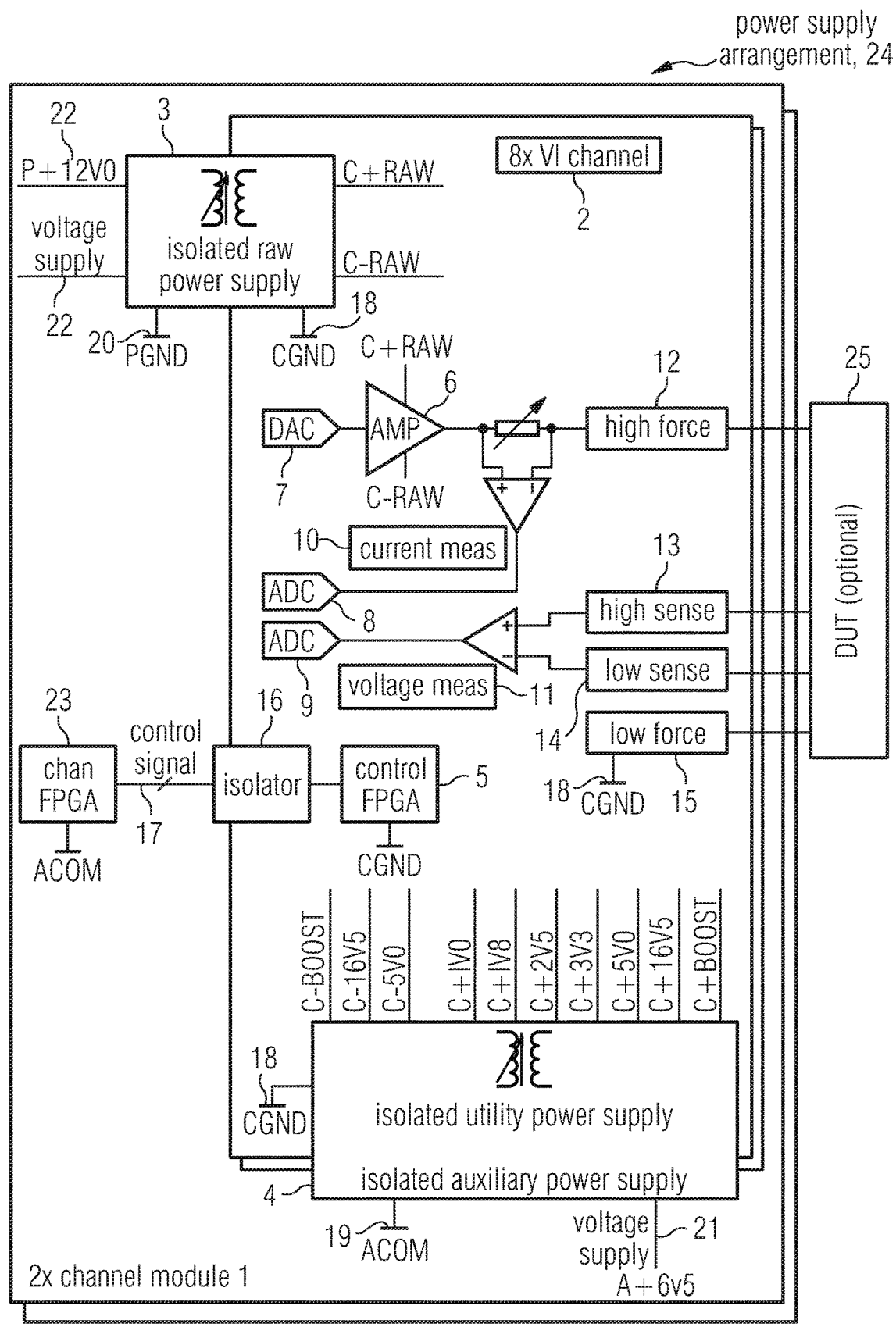
FIG. 1 shows a schematic diagram of an ATE floating V/I source, which includes power supplies that may be used and is optionally connected to a DUT.

FIG. 1 shows an example schematic diagram of a channel module 1 of a power supply arrangement of an ATE with one of the eight floating V/I channels 2, which is optionally connected to a DUT 25. For example, each V/I channel 2 is connected to a first voltage supply 22 through an isolated raw power supply 3, and to a second voltage supply 21 through an isolated auxiliary power supply 4, which may be considered as an isolated utility power supply. Also there is an isolated connection (isolator) 16 between a channel FPGA 23 associated with the channel module 1 and a control FPGA 5 associated with the V/I channel 2.

The isolator 16 translates and/or transfers the digital signal between the channel FPGA 23 and the control FPGA 5 since both GND (or both reference potentials) have different potential.

Each V/I channel 2 is configured to be optionally connected to the DUT 25 through a high force terminal 12 and a low force terminal 15 and through a high sense terminal 13, and a low sense terminal 14.

The high sense terminal 13 and the low sense terminal 14 are connected to a voltage measurement circuit 11. The voltage measurement circuit 11 is connected to an ADC 9. The high force terminal 12 is driven by an amplifier (AMP) 6. The low force terminal 15, the one or more secondary windings of the isolated raw power supply 3, the secondary windings of the isolated auxiliary power supply 4, and the control FPGA 5 are connected to a common ground (CGND) 18 of the V/I channel 2.

The AMP 6 is driven by a DAC 7 and is supplied by the dedicated isolated raw power supply 3. The current provided by the AMP 6 is measured by a current measurement circuit 10. The current measurement circuit 10 is connected to an ADC 8. The isolated raw power supply for power amplifier is not addressed in this invention. In other words details of the isolated raw power supply are out of relevance for the present invention.

The Control FPGA 5, the DAC 7, the ADC 8, the ADC 9, the current measurement circuit 10 and the voltage measurement circuit 11 are supplied by a plurality of output voltage levels of the isolated auxiliary power supply 4.

In other words, FIG. 1 is an example block diagram of the ATE floating V/I channel module 1 which consists of eight V/I channels 2 on it. Each channel has a dedicated isolated raw supply 3 for the AMP 6 and an isolated utility supply 4 for Control FPGA 5, DAC 7, ADC 8, ADC 9, current measurement circuit 10 and voltage measurement circuit 11, which have multiple output voltage levels for these circuits. The channel module negative terminal is called low force 15 and is connected to CGND 18 which is the common GND (or the common reference potential) for V/I Channel 2. The isolator 16 translate the digital signal between channel FPGA 23 and control FPGA 5 since both GND (or reference potentials of both circuit parts) have different potential.

The isolated auxiliary power supply is a multiple output isolated power supply. In this example schematic diagram, ten different voltage levels of the outputs of the isolated utility supply 4 is displayed.

TABLE 1

| Signal Name | Output voltage | Connect to | Current Max. | Used for |
| --- | --- | --- | --- | --- |
| C + 1V0 | +1.0 V | CGND | 600 mA | FPGA core |
| C + 1V8 | +1.8 V | CGND | 100 mA | ASIC Vcc |
| C + 2V5 | +2.5 V | CGND | 70 mA | ADC Vcc, I/O |
| C + 3V3 | +3.3 V | CGND | 30 mA | DAC Vcc, I/O |
| C + 5V0 | +5.0 V | CGND | 50 mA | ADC Vcc, DAC Vcc |

TABLE 1-continued

| Signal Name | Output voltage | Connect to | Current Max. | Used for |
|---|---|---|---|---|
| C − 5V0 | −5.0 V | CGND | 50 mA | DAC Vss, ASIC Vss |
| C + 16V5 | +16.5 V | CGND | 100 mA | DAC Vcc, OpAmp Vcc |
| C − 16V5 | −16.5 V | CGND | 100 mA | DAC Vss, OpAmp Vee |
| C + BOOST | +7.5 V | C + RAW | 30 mA | Boost Voltage for Power AMP |
| C − BOOST | −7.5 V | C − RAW | 30 mA | Boost Voltage for Power AMP |

Table 1 displays requirements of each voltage levels ("signal name") of the isolated utility supply 4 with its voltage value ("output voltage"), where it connects to ("connect to"), current maximum value ("current max.") and where or for what it is used for ("used for").

2. EMBODIMENT ACCORDING TO FIG. 2

FIG. 2 shows a schematic diagram of a conventional multiple output isolated power supply configured to provide a plurality of auxiliary voltages 146 to 157. The conventional multiple output isolated power supply comprises a plurality of isolated DC/DC converters 103 to 108 driven by Vin 100.

Secondary voltages of the DC/DC converters are regulated by low drop out voltage regulators (LDO) 109 to 116 or by Zener diodes 117, 118.

Primary sides of the DC/DC converters are grounded to ACOM 101. The secondary voltages of the DC/DC converters and the LDO's are grounded to CGND 102. The primary and the secondary groundings, ACOM 101 and CGND 102, of the DC/DC converters are connected by a plurality of decoupling capacitors C125 to C130.

In other words, FIG. 2 illustrates an example of a conventional utility supply block diagram to implement Table 1 requirement. From the table 1 requirements, it is understood (or understandable) that several 1-2 W class single or dual output isolated DC-DC convertors can achieve and/or realize the circuit. In the case of FIG. 2, six isolated DC/DC modules are used. To minimize the area, small-sized isolated DC/DC modules are selected. In most cases, these small-sized isolated DC/DC converter outputs are unregulated, and post voltage regulators may be used in order to have regulated voltages. LDOs are mainly used to have and/or provide accurate voltages and to minimize power dissipations. If voltage accuracy is not a concern, Zener-diodes are used for voltage/current regulation.

The isolated DC/DC converter 103 is a single output unregulated module for 3.3V, 2.5V, 1.8V and 1.0V output voltages. LDOs 109, 110, 111 and 112 are used to regulate these output voltages.

The Isolated DC/DC converter 104 is a dual outputs unregulated module for +5.0V and −5.0V. The LDO 113 and 114 are used to regulate these output voltages.

The isolated DC/DC converter 105 is a single output unregulated module for 16.5V. The LDO 115 is used to regulate the output voltage. The isolated DC/DC converter 106 is a single output unregulated module for −16.5V. The LDO 116 is used to regulate the output voltage.

Note that both +16.5V and −16.5V involve 1.65 W power so a dual output Isolated DC/DC converter cannot be used in this case.

The isolated DC/DC converter 107 is a single output unregulated module for C+BOOST. The Zener-diode 117 is used to regulate the output voltage. The isolated DC/DC converter 108 is a single output unregulated module for C−BOOST. The Zener-diode 118 is used to regulate the output voltage.

Note that both C+BOOST and C−BOOST common voltage potentials are not equal, so a dual output Isolated DC/DC converter cannot be used in this case.

C125 to C130 are common mode decoupling capacitors used to reduce common mode noise for each isolated DC/DC modules. The output capacitors C131 to C145 are, for example, configured to hold-up and to filter.

3. EMBODIMENT ACCORDING TO FIG. 3

FIG. 3 shows a schematic diagram of an embodiment of an invented multiple output isolated power supply configured to provide a plurality of auxiliary voltages 260 to 269.

The invented multiple output isolated power supply comprises a planar transformer 206. The planar transformer 206 comprises a primary winding 208, a ferrite core 207 and a plurality of secondary windings 209 to 213.

The primary winding 208 is configured to be driven by a slew rate controlled push-pull driver 280, which is configured to be supplied by an input voltage Vin 200. The slew rate controlled push-Pull driver 280 is grounded to ACOM 101.

The plurality of secondary windings 209 to 213 are wound around the same ferrite core 207. A plurality of secondary voltages provided by the plurality of secondary windings 209 to 213 are rectified by a plurality of rectifier diodes D228 to D241 and regulated by a plurality of LDOs 214 to 216 and 218 to 221 and/or one or more DC/DC converters 217 and/or one or more Zener-diodes 222, 223.

The secondary windings 209 to 213 and the LDO's 214 to 216 and 218 to 221 and the DC/DC converter 217 are grounded to CGND 202.

The primary grounding ACOM 201 and the secondary grounding CGND 202, to which taps of secondary windings of the planar transformer 206 are coupled, are connected by a plurality of common mode noise decoupling capacitors C224 to C227. With use of a high frequency slew rate controlled driver 280, amount of common mode decoupling capacitor can be reduced. The output capacitors C242 to C257 are configured to hold-up and to filter.

In other words FIG. 3 illustrates an embodiment of multiple output isolated utility power supplies which is consists of, for example, a slew rate controlled push-pull driver 280, a planar transformer 206, rectifier diodes 228 to 241, an LDO, a DC/DC module 217 or Zener-diodes 214 to 216 and 218 to 223. The push-pull DC transformer topology is a very straightforward switching power supply (topology). The two switches are turned on out of phase at 50% duty cycles. During the switch on time, Vin 200 is applied across (or to) the primary side of the transformer. The voltage on the secondary side of the transformer is simply Vin 200 times the turns ratio. The diodes are configured to rectify the secondary voltage and to generate an output voltage.

Some of the topology's advantages are:
1) Stepping up or down the input voltage can easily be done by setting the turns ratio.
2) The transformer provides isolation between the input side and output side.
3) Each switch cycle applies Vin 200 across the transformer in opposite polarities. Therefore, the transformer core never saturates and a separate reset circuit is not necessary. An imbalance in the two sides of the transformer can eventually cause the transformer to saturate. Also, during the turn-off of the switches, the leakage inductance causes a large undesirable voltage spike and become radiated electromagnetic interference (EMI). By controlling switch voltage slew rate and switch current slew rates, undesired voltage spike can be reduced resulting DC/DC becoming a low noise (EMI) voltage supply.

In the following, some additional details of the circuit 300 according to FIG. 3 will be described.

As mentioned before, the circuit 300 comprises a planar transformer 206, which comprises a primary winding 208. The primary winding 208 has a center tap 208*b*, which is connected to the input voltage VIN 200. A first end 208*a* of the primary winding 208 is connected to a first output SWA 203 of the slew rate-controlled push-pull driver 280, and a second end 208*c* is connected to a second output SWB 204 of the slew-rate controlled push-pull driver 280. Accordingly, the slew rate-controlled push-pull driver 280 can drive the primary winding 208 of the planar transformer in order to cause magnetic flux in two different directions.

The planar transformer 206 comprises a first secondary winding 209, which comprises a first end 209*a*, a tap 209*b* and a second end 209*c*. For example, the first secondary winding 209 is used to provide four output voltages 260, 261, 262, 263.

The first end 209*a* and the second end 209*c* of the first secondary winding 209 are coupled to a first terminal of a capacitor C242 via diodes D228, D229, to thereby form a full wave rectifier. Both the tap 209*b* of the secondary winding 209 and the second terminal of the capacitor C242 are connected to a reference potential 202 (CGND).

An input of a first low drop regulator 214 is coupled to the first terminal of the capacitor C242, and the first low drop regulator 214 provides, at its output, the first supply voltage 260 which may, for example, take the value of 3.3V. Inputs of two additional low drop regulators 215, 216 are coupled to the output of the first low drop regulator 214. The second low drop regulator 215 provides, at its output, a voltage of, for example, 2.5V, and the third low drop regulator 216 provides, at its output, a voltage of, for example, 1.8V. Accordingly, the power dissipation is split between the first low drop regulator 214 and the second low drop regulator 215 and the third low drop regulator 216.

Moreover, an input of a DC/DC converter 217 is coupled to the first terminal of the capacitor C242. For example, a voltage of 1.0V is provided at the output of the DC/DC converter 217. It should be noted that the voltage provided at the output of the DC/DC converter 217 is typically smaller than the output voltages provided by the low drop regulators 214, 215, 216. Accordingly, high losses can be avoided when providing the output voltage of 1.0V while eliminating the need to have an extra secondary winding for the provision of the output voltage 263 of 1.0V.

Moreover, a second secondary winding 210 is used to provide two output voltages 264, 265 having opposite polarities. The second secondary winding 210 comprises a first end 210*a*, a tap 210*b* and a second end 210*c*. The tap 210*b* is coupled to the reference potential CGND. The first end 210*a* and the second end 210*c* of the second secondary winding 210 are coupled to a capacitor C244 via diodes 230, 232, such that a current can flow (in a positive current direction) from the ends 210*a*, 210*c* of the second secondary winding 210 towards the first terminal of the capacitor C244. A second terminal of the capacitor C244 is connected to the reference potential CGND. Accordingly, the capacitor can be charged with a positive voltage between its first terminal and its second terminal. The first terminal of the capacitor C244 is also connected to an input of a low drop regulator 218, which provides, at its output, a supply voltage 266 of, for example, 5.0 V.

Moreover, the first end 210*a* and the second end 210*c* of the second secondary winding 210 are coupled to a first terminal of a capacitor C245 using diodes, such that a current can flow (in a positive current direction) from the first terminal of the capacitor C245 to the ends 210*a*, 210*c* of the second secondary winding 210. A second terminal of the capacitor C245 is connected to the reference potential CGND. Accordingly, the capacitor C245 can be charged with a negative voltage between its first terminal and its second terminal via the diodes 231, 233. An input of a low drop regulator 219 is coupled to the first terminal of the capacitor C245, and an output of the low drop regulator 219 provides a supply voltage 265 of, for example, −5.0V.

To conclude, the second secondary winding 210, which comprises a tap or center tap 210*b*, can be used to provide two supply voltages 264, 265, which may have opposite signs or which may even be symmetrical supply voltages.

A third secondary winding 211 is used to provide supply voltages 266 and 267, which may, for example, comprise different polarities and which may, for example, take values of +16.5 V and −16.5 V. The circuitry used to provide the supply voltages 266 and 267 may, for example, be structurally identical to the circuitry used to provide the supply voltages 264, 265, as can easily be seen in FIG. 3. Accordingly, a detailed discussion will be omitted here.

A fourth secondary winding 212 is used to provide one output voltage between C+BOOST 268 and C+RAW 258. The fourth secondary winding 212 comprises a first end 212*a*, a tap 212*b* and a second end 212*c*. The first end 212*a* and the second end 212*c* of the fourth secondary winding 212 are coupled to a capacitor 248 via diodes D238 and D239, such that a current can flow (in a positive current direction) from the ends 212*a*, 212*c* of the fourth secondary winding 212 towards the first terminal of the capacitor C248. A second terminal of the capacitor C248 is connected to the tap 212*b*. The first terminal of the capacitator C248 is also connected to a cathode of a Zener-diode VZ222. The second terminal of the capacitor C248 is also connected to an anode of the Zener-diode VZ222.

The cathode of the Zener-diode VZ222 is also connected to the output terminal C+BOOST 268. The anode of the Zener-diode VZ222 is also connected to the output terminal C+RAW 258. Accordingly, it can be reached that the potential at the terminal C+BOOST is higher than a potential at the terminal C+RAW by the Zener-Voltage of the Zener-diode VZ222.

A fifth secondary winding 213 is used to provide a supply voltage between C−BOOST 269 and C−RAW 259. The circuitry used to provide the supply voltage between C−BOOST 269 and C−RAW 259 may, for example, be structurally identical to the circuitry used to provide the supply voltage between C+BOOST 268 and C+RAW 258, as it can be seen in FIG. 3. Accordingly, a detailed discussion will be omitted here.

4. 3D MODEL ACCORDING TO FIG. 4

FIG. 4 shows a 3D model of a conventional utility supply implemented in a 8 channel (8 ch) floating V/I source. An area 400 of a conventional multiple output isolated power supply, which is indicated by a red or bold line 410, displays the part or area of the utility supply. A total of four isolated DC/DC modules can be seen in that area. Two other DC/DC modules are mounted on the other side of the PCB. Looking at this image or model, it is understandable that the multiple utility supply occupies a pretty large area of the board. Also it is understandable that the area of the conventional utility supplies become an obstacle to achieve higher number of V/I source channels.

5. 3D MODEL ACCORDING TO FIG. 5

Figure 5:
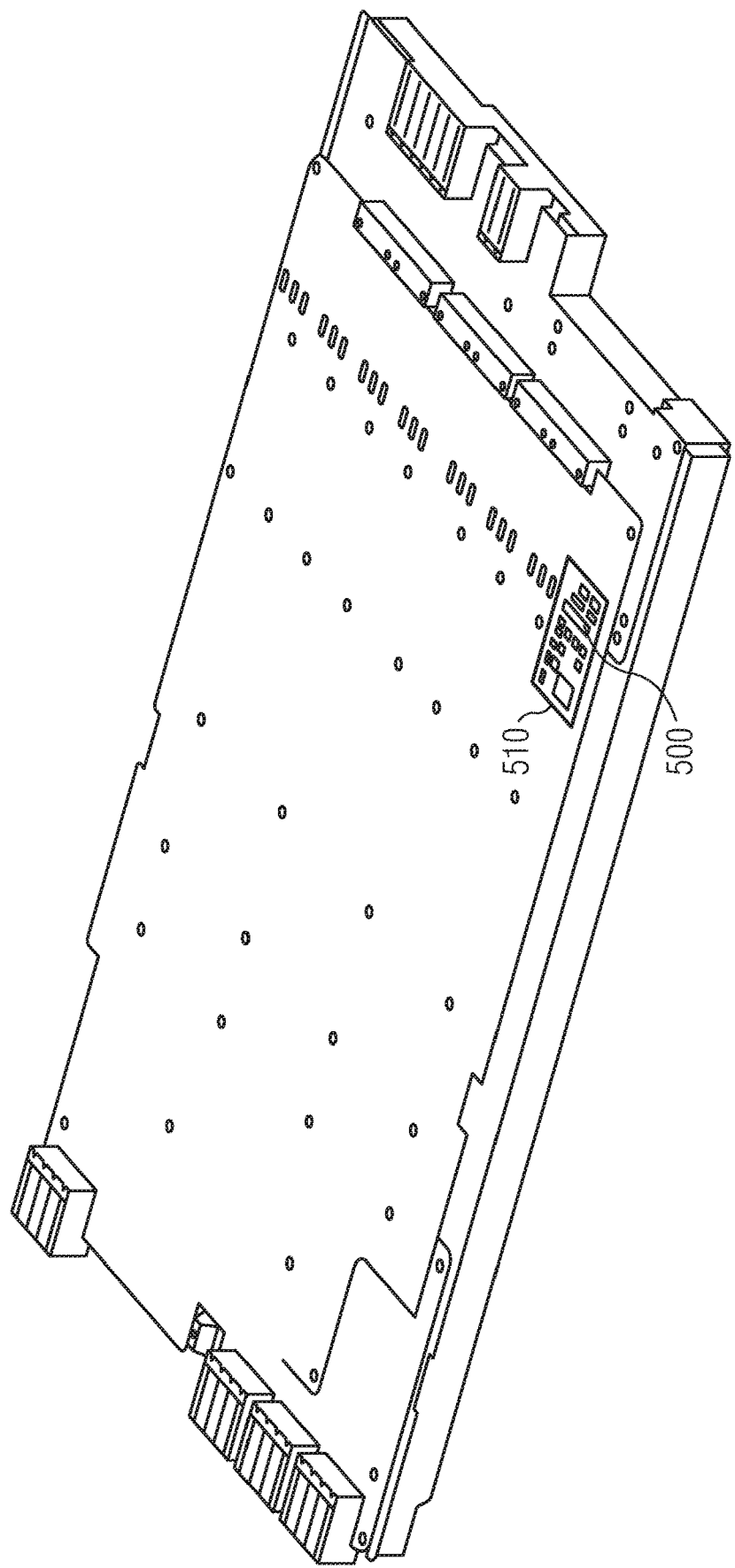
FIG. 5 shows a 3D model of an embodiment of an invented multiple output isolated utility power supply.

FIG. 5 shows a 3D model of an embodiment of an invented utility supply implemented in a 13 channel (16 ch) floating V/I source. An area 500 of an invented multiple output isolated power supply, which is indicated by a red or bold line 510, displays all parts of a utility supply. One slew rate controlled driver, one ferrite core and a plurality of LDOs and other components can be seen. The planar transformer windings are embedded in the PCB.

It is understandable that the read (or red) area of FIG. 5 compared to the red area of FIG. 4 is significantly reduced.

The isolated DC-DC converter is relatively expensive and area consuming. Alternatively, it is possible to use a custom transformer instead of a planar transformer. However, custom transformers are expensive and they are not low-profile. So area and cost of the invented multiple isolated utility power supply can be reduced compared to a conventional utility multiple supply. Table 2 displays a realistic exemplary comparison of an invented multiple isolated power supply against a conventional multiple isolated power supply.

TABLE 2

|       | Area | Cost | Noise |
|-------|------|------|-------|
| Ratio | 17%  | 29%  | 70%   |

6. PLANAR TRANSFORMER ACCORDING TO FIG. 6

Figure 6:
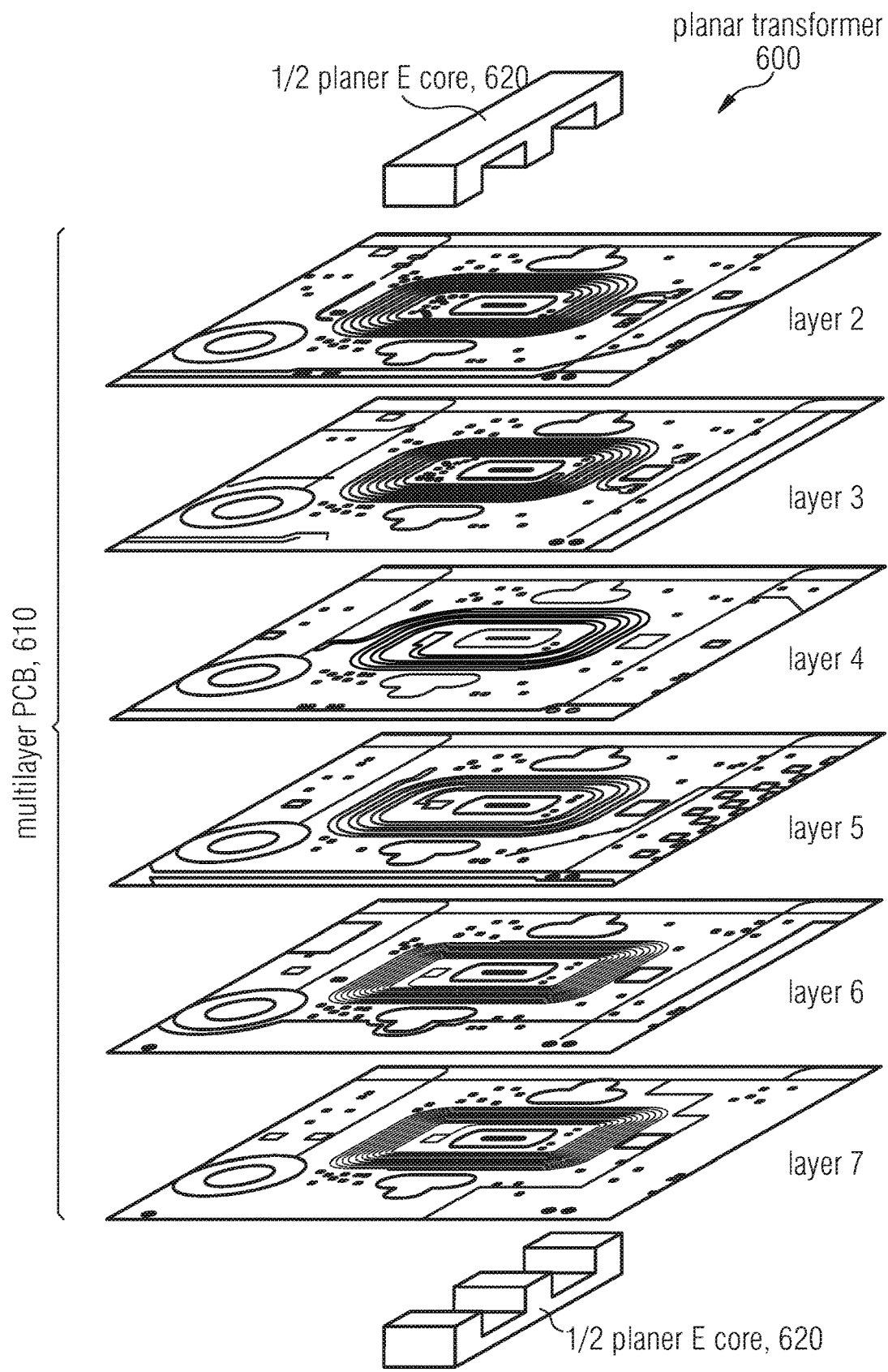
FIG. 6 shows a schematic representation of a planar transformer, which consists of (or comprises) a multi-layer PCB and a ferrite planar core.

FIG. 6 shows a schematic representation of a planar transformer 600, which may, for example, be the planar transformer of the planar transformer 206 or of the planar transformer 970. The planar transformer 600 is arranged on and/or in a multi-layer PCB 610 (for example, a multi-layer PCB on which components of the slew-rate-controlled push-pull driver, of the rectifiers, of the low drop-out voltage regulators, of the DC/DC converters, etc. are mounted). The planar transformer 600 comprises a ferrite planar E-core 620 and a plurality of etched spiral patterns on or in layers of the PCB 610 to form "windings", replacing the turns of wire of the conventional types of transformer. The plurality of etched spiral patterns are wound around the common ferrite planar E-core 620, are associated with different output channels and are arranged on or in different layers of the PCB 610.

The important advantages of a planar transformer are for example: very low profile, excellent thermal characteristics, low leakage inductance and excellent repeatability of properties.

7. PLANAR TRANSFORMER ACCORDING TO FIG. 7

Figure 7:
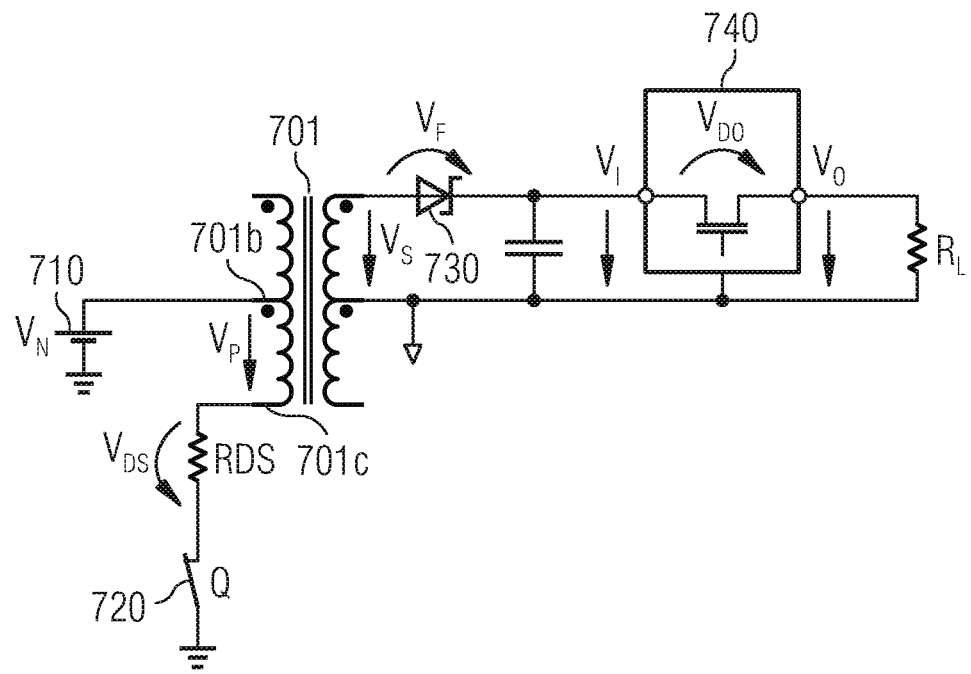
FIG. 7 shows a simplified schematic representation of planar transformer.

FIG. 7 shows a simplified schematic representation of a planar transformer 701, e.g. together with a primary drive circuit and a secondary circuit. The planar transformer may, for example, take the place of the planar transformer 206, and the secondary circuit may, for example, be an output channel of the output channels 260 to 269, and the output voltage Vo may be, for example, one of the output voltages 260 to 269.

A tap 701b of the primary winding is coupled to an input voltage Vin 710. The primary winding (or more precisely an end 701c thereof) is configured to be grounded through a FET-switch 720, which may, for example, be a part of a slew-rate controlled push-pull driver 280. A voltage induced in a secondary winding is rectified by a Schottky-diode 730 and regulated by an LDO transistor 740. The Shottky-diode 730 may be, for example, one of the rectifying diodes D228 to D241 and the LDO transistor 740 may be, for example, one of the LDOs 214 to 216 or 218 to 221.

In the following, some design considerations for the circuit shown in FIG. 7 is provided. Here:
$V_{IN}$: Input Voltage
$I_D$: Input current
$V_{DS}$: Voltage drop caused by copper resistance (DCR) and FET switch ($R_{DS}$)
$V_F$: Rectifier forward voltage
$V_{DO}$: LDO drop out voltage
Eff: Efficiency
$N_P$: Primary winding turns
$N_S$: Secondary winding turns The input voltage of LDO $V_I$ involves:

$$V_I \approx V_O + V_{DO} \tag{1}$$

The winding ratio (or turns ratio) can be described using following simplified equation:

$$\frac{N_S}{N_P} = \frac{1}{Eff} * \frac{V_F + V_I}{V_{IN} - R_{DS} * I_D} \tag{2}$$

Here, Eff is mainly caused by cross conduction prevention (brake before make) circuitry and a slew rate control of both switches in or of a driver. Also it contains (or suffers from) a core loss, a skin effect etc. but most (of them) are neglectable compared to a cross conduction loss.

$V_I$ can be described from above equation:

$$V_I = \frac{N_S}{N_P} * Eff * (V_{IN} - R_{DS} * I_D) - V_F \tag{3}$$

From these equations, rectifier diodes were used shottky diodes which $V_F$ is small. Also if $R_{DS}$ is large, $V_I$ is reduced and total efficiency is reduced. To reduce the $R_{DS}$, the primary and some of the secondary windings, which output current may be used, are using paralleled etch pattern.

For example to satisfy the output requirement of Table 1, five secondary windings may be used. To achieve winding that may be used in limited layer of PCB, number of windings may be considered. Since secondary windings are (or defined by a) ratio of the primary winding, minimizing primary winding is essential.

The next step to calculate a high frequency planar transformer, is usually to choose an appropriate core. Then the primary number of turns $N_P$ is calculated because this determines the magnetic flux-density within the core (in order to) not to saturate during the operation. The change of a flux density $\Delta B$ and the primary winding $N_P$ can be described below $$\Delta B = \frac{V_{IN} * T/2}{N_P * A_{min}} \quad (4)$$

Or $$N_P = \frac{V_{IN} * T/2}{\Delta B * A_{min}} \quad (5)$$

Here:
$\Delta B$: Change of flux density
T: Period of input waveform
$A_{min}$: Minimum core cross section The change $\Delta B$ of flux-density depends on a frequency $f=1/T$ and the number of turns $N_P$. The higher the frequency and the number of turns the lower the change of the flux density. Now the minimum number of turns $N_P$ can be calculated to ensure that a certain change of the flux-density $\Delta B$ is not exceeded. The saturation flux density of +/−0.3 T, (which means $\Delta B$=0.6 T) cannot be used normally for high frequency transformers. In push-pull converters going around the hysteresis loop with every clock cycle would cause unacceptable losses, i.e. heat generation. If no further information concerning core losses and thermal resistance is available, $\Delta B$ should be limited to $\Delta B$=0.3 . . . 0.2 T with usual frequencies (20 KHz to 1 MHz). Basically $A_{min}$ determine the size of the ferrite core. In order to reduce the number of primary winding $N_P$, a driver frequency is selected as 400 KHz. Then each secondary winding 209-213 $N_S$ is calculated from equation (3).

The secondary output voltage $V_I$ described in equation (3) changes by efficiency and the current $I_D$. So the each output voltage are unregulated and also involve LDO or Zener-diode for its output. For example C+1V0 output may use larger current, small sized DC/DC is used to pretend large LDO power dissipation and efficiency loss.

One or more of the above mentioned design considerations may, for example, be applied in the multiple output isolated power supply 300 according to FIG. 3.

8. CONFIGURATION ACCORDING TO FIG. 8

Figure 8:
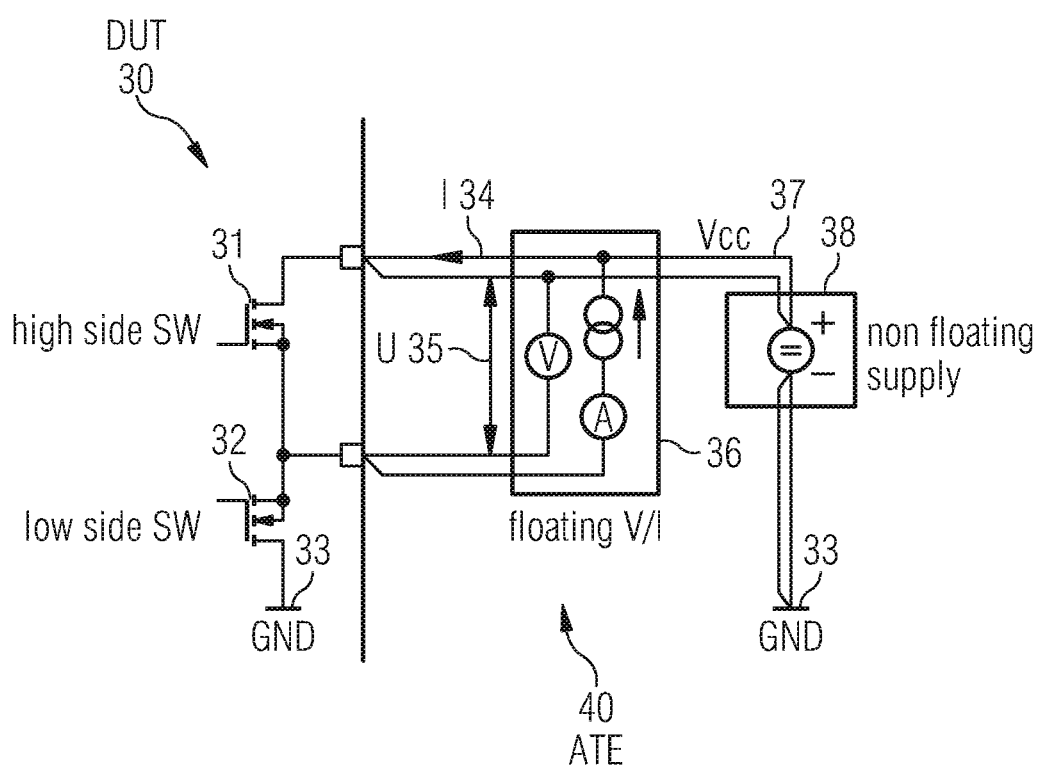
FIG. 8 shows a simplified schematic diagram of a usage of the floating V/I source for High side switch testing.

FIG. 8 shows a simplified schematic diagram of a connection between a high side switch 31 (of a DUT 30) and a floating V/I source 36 (of the ATE 40) for its testing (or in order to test the high side switch 31). The floating V/I positive and negative terminals are connected to (across) the high side switch 31 in order to apply current to the switch. The floating V/I source 36 is supplied by a grounded GND 33 non-floating power supply 38. This explains for example why floating V/I may be used.

9. EMBODIMENT ACCORDING TO FIG. 9

Figure 9:
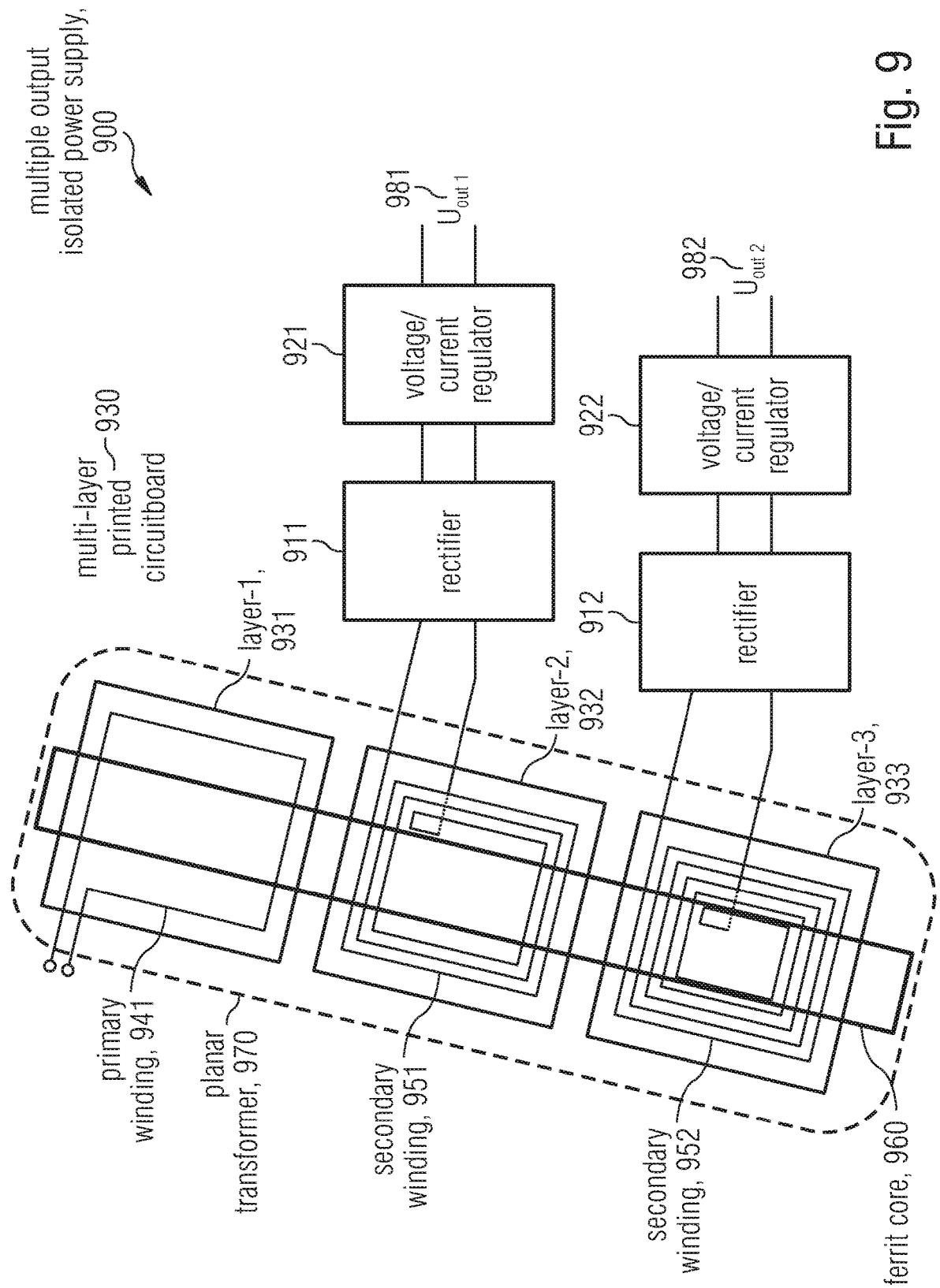
FIG. 9 shows a schematic representation of a multiple output isolated power supply, according to an embodiment current invention.

FIG. 9 shows a schematic representation of a multiple output isolated power supply configured to provide a plurality of output voltages (Uout) 981, 982. The multiple output isolated power supply comprises a planar transformer 970 arranged on or in a multi-layer PCB. The planar transformer 970 comprises a primary winding 941 and a plurality of secondary windings 951, 952 around a common ferrite core 960. The plurality of secondary windings 951, 952 are associated with different output channels and are arranged on or in different layers of the PCB. A plurality of secondary voltages are first rectified by a plurality of rectifiers 911, 912 and then regulated by a plurality of voltage regulators 981, 982 or a plurality of current regulators 981, 982.

This embodiment can optionally be supplemented by any of the features and functionalities and details described here.

10. METHOD ACCORDING TO FIG. 10

Figure 10:
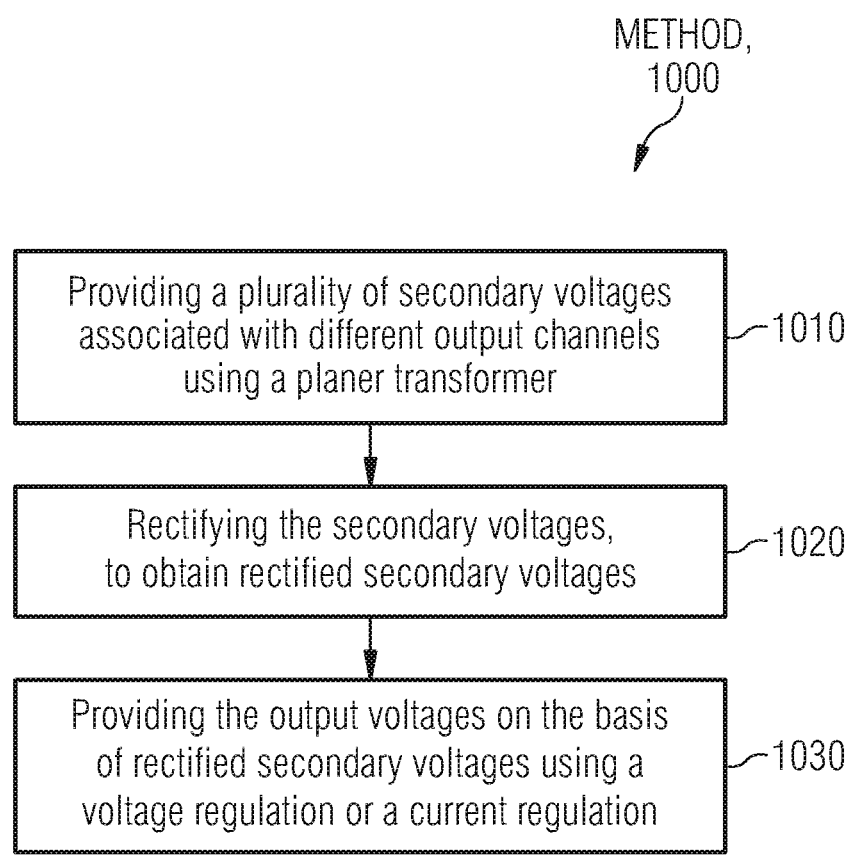
FIG. 10 shows a flowchart of a method according to an embodiment of the present invention.

FIG. 10 shows a flowchart of a method according to an embodiment of the present invention.

The method comprises providing 1010 a plurality of secondary voltages associated with different output channels using a planar transformer.

The method also comprises rectifying 1020 the secondary voltages to obtain rectified secondary voltages.

The method also comprises providing 1030 the output voltages on the basis of rectified secondary voltages using a voltage regulation or a current regulation.

This method is based on the same considerations as the above-described embodiments. Also the method can be supplemented by any of the features, functionalities and details described herein.

11. FURTHER EMBODIMENTS

An embodiment that creates a multiple output isolated utility power supply for an automated test equipment (ATE) floating voltage/current (V/I) source is presented. The multiple output isolated power supplies comprises:

a. a high frequency slew-rate controlled push pull driver;
b. a planar transformer, which comprises multiple secondary windings for multiple output voltages embedded in the same multi-layer print circuit board (PCB) as the floating V/I source channel module;
c. a ferrite core for the planar transformer;
d. rectifiers, which comprise shottky diodes and capacitors;
e. low drop out (LDO) voltage regulators;
f. DC-DC converters; and
g. Zener diodes.

Thus the multiple output isolated utility power supply has low-profile, low-cost and low-noise feature which enables a low noise and a higher number of channels of the ATE floating V/I source.

This embodiment can optionally be supplemented by any of the features and functionalities and details described here.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A multiple output isolated power supply for usage in automated test equipment, the multiple output isolated power supply comprising:
a multi-layer printed circuit board (PCB); and
a planar transformer comprising a plurality of secondary windings associated with different output channels and arranged on the multi-layer PCB;
wherein at least two output channels of the different output channels respectively comprise: a rectifier; and either a voltage regulator or a current regulator.

2. The multiple output isolated power supply according to claim 1, further comprising a high frequency slew-rate controlled push pull driver configured to drive a primary winding of the planar transformer.

3. An Automatic Test Equipment (ATE) comprising a multiple output isolated power supply, the multiple output isolated power supply comprising:
a multi-layer printed circuit board (PCB); and
a planar transformer comprising a plurality of secondary windings associated with different output channels and disposed on the multi-layer PCB;
wherein at least two output channels of the output channels comprise: a rectifier; and a voltage regulator or a current regulator.

4. The ATE according to claim 3, where at least one of the rectifiers comprises a Schottky diode.

5. The multiple output isolated power supply according to claim 1, further comprising a secondary reference potential and wherein at least one of the plurality of secondary windings is configured as a dual output winding, wherein a tap of the dual output winding is coupled to the secondary reference potential.

6. The multiple output isolated power supply according to claim 1, wherein the planar transformer comprises a ferrite core.

7. The multiple output isolated power supply according to claim 1, wherein at least one of the rectifiers comprises a Schottky diode.

8. The multiple output isolated power supply according to claim 1, wherein at least one of the voltage regulator or current regulator comprises one of a low drop-out voltage regulator (LDO) and a Zener diode.

9. The multiple output isolated power supply according to claim 1, wherein one of the output channels comprises a switching DC/DC converter, and wherein an input of the switching DC/DC converter is coupled to a secondary winding of the one output channel, and
wherein at least one linear voltage regulator is also coupled to the secondary winding of the one output channel,
wherein a single secondary winding is used to provide a first output voltage using a linear voltage regulation and is used to provide a second output voltage using the switching DC/DC converter.

10. The multiple output isolated power supply according to claim 1, further comprising a secondary reference potential and wherein at least one of the secondary windings is configured to be a dual output winding, wherein a tap of the dual output winding is coupled to the secondary reference potential, and
wherein the secondary reference potential is configured to provide voltages of two different polarities using a rectification and regulation of voltages provided by the dual output winding.

11. The ATE according to claim 3, where the planar transformer comprises a ferrite core.

12. The ATE according to claim 3, where at least one of the plurality of secondary windings is configured to be a dual output winding, and wherein further a tap of the dual output winding is coupled to a secondary reference potential of the multiple output isolated power supply.

13. The ATE according to claim 3, wherein the multiple output isolated power supply further comprises a high frequency slew-rate controlled push pull driver configured to drive a primary winding of the planar transformer.

14. A method for providing multiple isolated output voltages for use in an automated test equipment, wherein the method comprises:
providing a plurality of secondary voltages associated with different output channels using a single planar transformer; and
rectifying the secondary voltages to achieve rectified secondary voltages; and
providing the output voltages on the basis of rectified secondary voltages using one of a voltage regulation and a current regulation.

15. The method of claim 14, wherein the planar transformer comprises a primary winding and a plurality of secondary windings around a same core, and wherein the plurality of secondary voltages are driven by a same magnetic flux.

16. The method of claim 14, where the planar transformer comprises a ferrite core.

17. The method of claim 14, wherein the voltage regulation is performed by a voltage regulator and the current regulation is performed by a current regulator, and wherein at least one of the voltage regulator or the current regulator comprises a low drop-out voltage regulator (LDO).

18. The method of claim 14, wherein the voltage regulation is performed by a voltage regulator and the current regulation is performed by a current regulator, and wherein at least one of the voltage regulator or the current regulator comprises a Zener diode.

* * * * *